(12) United States Patent
Slutsky et al.

(10) Patent No.: US 8,710,523 B2
(45) Date of Patent: Apr. 29, 2014

(54) DEVICE CHIP CARRIERS, MODULES, AND METHODS OF FORMING THEREOF

(75) Inventors: Joel Slutsky, Durham, NC (US); Brian D. Veeder, Knightdale, NC (US); Thomas Lin, Taoyuan (TW)

(73) Assignee: E I du Pont de Nemours and Company, Wilmington, DE (US)

( * ) Notice: Subject to any disclaimer, the term of this patent is extended or adjusted under 35 U.S.C. 154(b) by 1368 days.

(21) Appl. No.: 11/891,366

(22) Filed: Aug. 10, 2007

(65) Prior Publication Data
US 2008/0035943 A1 Feb. 14, 2008

Related U.S. Application Data

(60) Provisional application No. 60/837,005, filed on Aug. 11, 2006.

(51) Int. Cl.
*H01L 33/00* (2010.01)
*H01L 21/00* (2006.01)

(52) U.S. Cl.
USPC ......... 257/98; 257/432; 257/E33.001; 438/26

(58) Field of Classification Search
USPC ............... 257/98, 101, 103, E33.001; 438/26
See application file for complete search history.

(56) References Cited

U.S. PATENT DOCUMENTS

| | | | |
|---|---|---|---|
| 3,597,259 A * | 8/1971 | Wainer et al. | 427/64 |
| 3,699,404 A * | 10/1972 | Simon et al. | 257/11 |
| 4,313,262 A | 2/1982 | Barnes et al. | |
| 4,374,159 A * | 2/1983 | Pitetti et al. | 216/6 |
| 5,258,335 A * | 11/1993 | Muralidhar et al. | 501/20 |
| 5,555,112 A * | 9/1996 | Oritsuki et al. | 349/46 |
| 5,687,062 A | 11/1997 | Larson | |
| 5,774,336 A | 6/1998 | Larson | |
| 6,953,698 B2 * | 10/2005 | Casey et al. | 438/15 |
| 2005/0074915 A1 * | 4/2005 | Tuttle et al. | 438/57 |
| 2005/0170211 A1 * | 8/2005 | Fujioka | 428/690 |

FOREIGN PATENT DOCUMENTS

| | | |
|---|---|---|
| DE | 3520945 A1 | 12/1986 |
| EP | 0 139 205 A2 | 5/1985 |
| EP | 0 416 898 A2 | 3/1991 |
| EP | 1 615 267 A1 | 1/2006 |
| GB | 2 206 451 A | 1/1989 |

OTHER PUBLICATIONS

PCT International Search Report and Written Opinion for International Application No. PCT/US2007/017844 dated Feb. 29, 2008.

* cited by examiner

*Primary Examiner* — Lynne Gurley
*Assistant Examiner* — Vernon P Webb

(57) ABSTRACT

The present invention provides novel methods of forming component carriers, component modules, and the carriers and modules formed therefrom which utilize thick film technology. In some embodiments, these methods are used to form lighting device chip carriers and modules. In further embodiments, these lighting device chip carriers and modules are used in LED applications.

18 Claims, 1 Drawing Sheet

DEVICE CHIP CARRIERS, MODULES, AND METHODS OF FORMING THEREOF

FIELD OF INVENTION

This invention is related to the formation of a thermally efficient chip carrier and module. In particular, this invention is related to dielectric thick film compositions and the use of said compositions in the formation of chip carriers and modules. Some embodiments of the invention are related to Light Emitting Diode (LED) chip carriers and modules for various lighting applications including, but not limited to, LED backlights, Liquid Crystal Display (LCD) lighting, display-related light sources, automotive lighting, decorative lighting, signage and advertisement lighting, and information display applications.

TECHNICAL BACKGROUND OF THE INVENTION

Solid state electronic devices can be fabricated with conjugated organic polymer layers. Conjugated polymer-based diodes and particularly light emitting diodes (LEDs) and light-detecting diodes are especially attractive due to their potential for use in display and sensor technology. This class of devices has a structure that includes a layer or film of an electrophotoactive conjugated organic polymer bounded on opposite sides by electrodes (anode and cathode) and carried on a solid substrate.

Generally, materials for use as active layers in polymer diodes and particularly PLEDs include semiconducting conjugated polymers that exhibit photoluminescence. In certain preferred settings, the polymers exhibit photoluminescence and are soluble and processible from solution into uniform thin films.

The anodes of these organic polymer-based electronic devices are conventionally constructed of a relatively high work function metal. This anode serves to inject holes into the otherwise filled p-band of the semiconducting, luminescent polymer.

Relatively low work function metals, such as barium or calcium, are preferred as the cathode material in many structures. This low work function cathode serves to inject electrons into the otherwise empty p*-band of the semiconducting, luminescent polymer. The holes injected at the anode and the electrons injected at the cathode recombine radiatively within the active layer and light is emitted.

LED lighting can commonly be characterized by on-axis luminous intensity expressed in candela. Intensity describes the flux per solid angle radiated from a source of finite area. Furthermore, flux is the total amount of light emitted from a source in all directions. For the purpose of this invention, flux will be used to describe the brightness of LEDs.

Radiometric light is specified according to its radiant energy and power without regard for the visual effects of the radiation. Photometric light is specified in terms of human visible response according to the CIE standard observer response curve. Furthermore, in the fields of photonics and solid state physics, luminous efficacy is defined as the conversion between photometric flux, expressed in lumens, and radiometric flux, expressed in watts.

It is noted that the luminous efficacy is a function of the dominant wavelength of a specific LED lighting source. For example, an Indium Gallium Nitride (InGaN) LED shows increasing luminous efficacy from 85 to 600 lumens per watt corresponding to a shifting of the dominant wavelength from 470 to 560 nm. On the other hand, an Aluminum Indium Gallium Phosphide (AlInGaP) shows decreasing luminous efficacy from 580 to 800 lumens per watt corresponding to a shifting of the dominant wavelength from 580 to 640 nm. For the purpose of this invention, luminous efficacy at the peak transmittance of LED is referred.

Most typical prior art LEDs are designed to operate no more than 30-60 milliwatts of electrical power. More recently, commercial LEDs capable of continuous use at one watt of input power were introduced. These LEDs use much larger semiconductor chips than previous LEDs to handle the large power. In order to dissipate heat to minimize junction temperature and maintain lighting performance, these larger chips are normally mounted to a more effective thermal conductor (such as metal slugs) than previous LED structures.

Typically, the 5-watt LEDs are available with efficacy of 18-22 lumens per watt; the 10-watt LEDs are available with efficacy of 60 lumens per watt. These 10-watt LED light devices will produce about as much light as a common 50-watt incandescent bulb and will facilitate use of LEDs for general illumination needs.

Despite the LED devices currently available, a need still exists for improved LED modules which can provide improved performance characteristics, such as increased heat dissipation qualities, improved manufacturing processes, and lower cost benefits. Other benefits include closer TCE match to the chip, smaller size, light weight, environmental stability, increased circuit integration capability, enhanced light reflectivity, simplified fabrication, higher yield, broader process tolerance, high mechanical strength, and effective heat dissipation. None of the prior art LEDs provide for the use of a thick film dielectric paste composition in the formation of a LED chip carrier and LED module which leads to improved dielectric properties in the base material (anodized layer in some embodiments) and therefore improved performance characteristics.

Existing technology or materials may not be able to withstand high heat applications, especially during processing. Typical organic materials are cured at less than 300° C. Thick film technology can withstand high heat applications such as those applications above 300° C.

One example is U.S. Pat. No. 5,687,062 to Larson. Larson discloses a thermally efficient circuit board which has a base layer with high thermal conductivity and a thermal expansion coefficient close to that of silicon, such as aluminum carbide. Above the base layer is a layer of anodized metal, either a separate material, such as aluminum, which is formed on the base and then anodized, or an anodized portion of the base itself. To the anodized metal is then applied a sealant material of lower thermal conductivity, but good electrically insulative and adhesive qualities, such as Teflon® FEP. The sealant flows into cavities in the porous anodized metal structure, creating a well-anchored bond. A metal foil layer is then bonded to the surface of the sealant, and used to pattern conductive circuit paths using conventional methods. Larson discloses that the microscopic cavities of the anodized metal allows anchoring of the sealant material which flows into its pores. Larson further discloses that the Teflon® FEP is heated to its melting temperature of 300° C., and is then forced at a pressure of 275 psi into the porous surface of the aluminum oxide where the anodized metal functions as a matrix for the sealant resulting in an anchoring of the sealant to the anodized metal.

For example, printed circuit board designs are typically formed with such organic materials and cannot withstand the high temperatures necessary for high heat applications. The present invention is useful in high temperature, high heat applications, like high power LED applications.

Various design and configuration of the LED chip carrier devices have been provided in the art. However, they all presented problems related to various functions, manufacturability, and cost. Functioning LED devices with superior performance characteristics are still needed for lighting applications, including modules for LCD applications, which allow for the improvement in heat dissipation properties and thermal conductivity properties to improve the overall color quality of emitting light diode modules and increase the module life. Furthermore, there still exists a need for a LED device which allows for a decrease in production costs and the ability to produce a LED device with a large area. The present inventors have provided such materials, methods, chip carriers, and modules to allow for such an innovation in lighting technology.

SUMMARY OF THE INVENTION

The present invention provides a method of forming a chip carrier comprising: providing a base material having lower and upper opposing surfaces; providing a dielectric thick film composition; applying said dielectric thick film composition to said upper surface of said base material; firing said dielectric thick film composition and said base material, thus forming a structure comprising a fired base layer and a fired dielectric layer; and applying a conductive layer at least partially covering said dielectric layer. In a further embodiment, a method of forming a chip carrier is disclosed which further comprises the steps firing said conductive layer; providing at least one component; applying a component attachment material to said dielectric layer; placing said component on said component attachment material; and connecting said component to said conductive layer.

Figure 1:
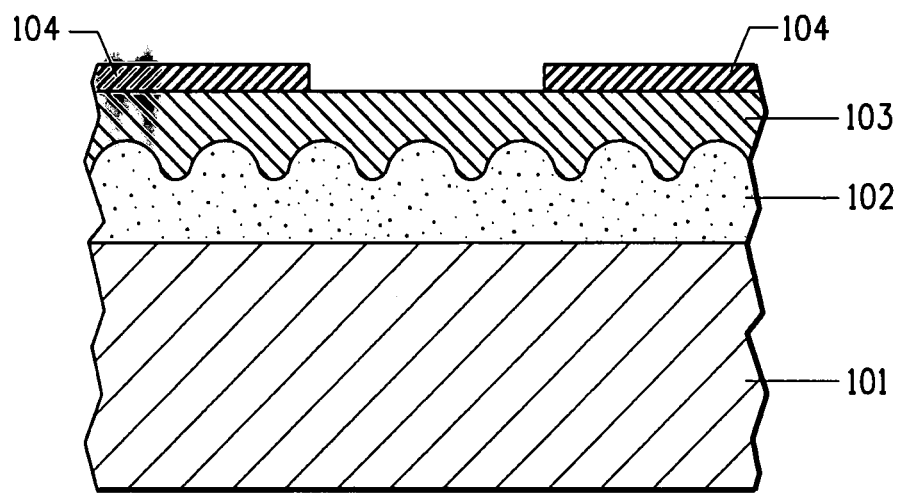
FIG. 1 represents a cross-sectional side view of the chip/component carrier of the present invention.

The following identifiers describe the elements represented in the figures:

| | |
|---|---|
| Base layer | 101 |
| Oxidized layer | 102 |
| Dielectric layer | 103 |
| Conductive layer | 104 |
| Component Attachment Material | 105 |
| Chip/Component | 106 |
| Wire Bond(s) | 107 |

DETAILED DESCRIPTION OF THE INVENTION

While the present invention is described by referring to LED applications, it is understood that various embodiments may be used in a multitude of electronic applications, including various lighting applications. The present invention further provides for novel lighting devices including: (1) thin and lightweight message displays, such as public information signs at airports, train stations, and other places; (2) status indicators, such as on/off lights on professional instruments and consumers audio/video equipment; (3) infrared LEDs in remote controls for TVs, DVDs, and VCRs; (4) clusters in traffic signals to replace ordinary light bulbs behind colored glass; (5) car indicator lights; (6) bicycle lighting; (7) calculator and measurement instrument displays; (8) red or yellow LEDs for indicator and alpha numeric displays in environments where night vision must be retained, such as in aircraft cockpits, submarine and ship bridges, astronomy observatories, and in the fields such as night time animal watching and military field use; (9) red or yellow LEDs in photographic darkrooms to provide lighting which doesn't result in unwanted exposure of films; (10) illuminations such as flashlights or torches; (11) emergency or signaling beacons and strobes; (12) movement sensors for mechanical and optical computer mice and trackballs; (13) high-end LED printers; and (14) general household illuminations.

This invention discloses an improved fabrication method to provide an improved chip carrier and module. In LED applications, the chips may be for instance one (white, Red, Green, or Blue) or a multiplicity of at least three (White, Red, Green, and Blue) LED chips with either a built-in circuit driver or a connection to an external circuit driver while providing passage ways for heat dissipation.

It is noted that some specific combination of LED chip and any associated optical materials are needed to provide white light from a single chip set or module. For the purpose of this invention and prevailing throughout the text and claims, white LED chip is used to represent these types of specific LED chip and optical material combinations so long as white light is produced by them. For example, most white LEDs in production today use a 450-470 nm blue Gallium Nitride (GaN) LED covered by a yellowish phosphor coating usually made of Cerium-doped yttrium Aluminum garnet (YAG:Ce) crystals. The single crystal form of YAG:Ce is considered as a scintillator rather than a phosphor. Since yellow light stimulates the red and green receptors of the human eyes, the resulting mix of blue and yellow light gives the appearance of white. White LEDs can also be made by coating near UV emitting LEDs with a mixture of high efficiency Europium based red and blue emitting phosphors plus green emitting copper and aluminum doped zinc sulfide (ZnS:Cu,Al). Another option to produce white light LEDs uses no phosphors and is based on homoepitaxially grown Zinc Selenide (ZnSe) on a ZnSe substrate which simultaneously emits blue lights from its active region and yellow from the substrate. Although a white light is normally applied as a LCD (Liquid Crystal Display) backlight, regardless of whether the light is coming from an aforementioned single chip set or a combination of Red, Green, and Blue LED's.

Method of Forming a Chip/Component Carrier

The present invention provides a novel method of forming a chip (or component) carrier comprising: (1) providing a base material having lower and upper opposing surfaces; providing a dielectric thick film composition; applying said dielectric thick film composition to said upper surface of said base material; firing said dielectric thick film composition and said base material, thus forming a structure comprising a fired base layer and a fired dielectric layer; applying a conductive layer at least partially covering said dielectric layer.

Figure 2:
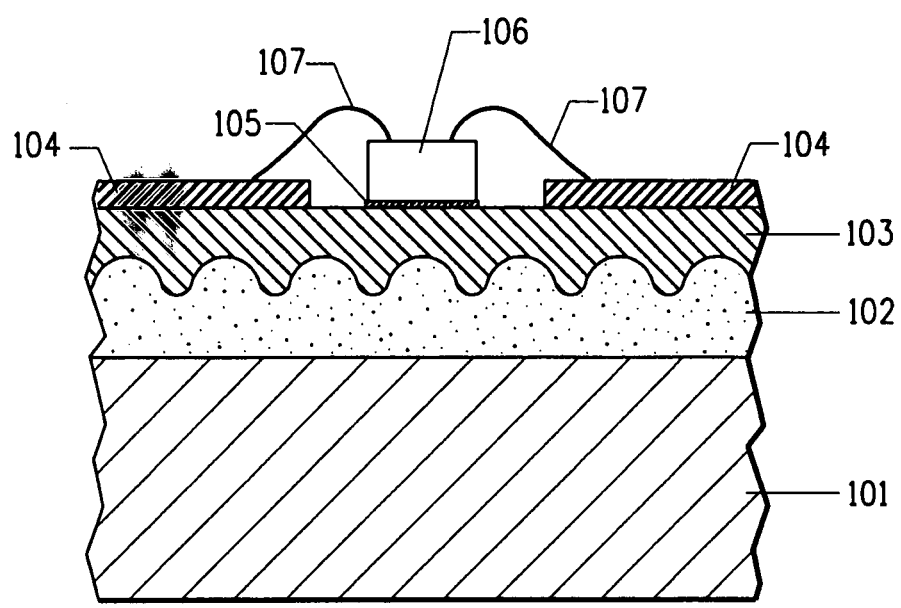
FIG. 2 represents a cross-sectional side view of the chip/component module of the present invention wherein a component is mounted.

In FIG. 1, the base material is comprised of base Al (FIG. 1, item 101) and an oxidized layer (FIG. 1, item 102). The dielectric layer is represented by FIG. 1, item 103; and the conductive layer (FIG. 1, item 104). It is important to note that FIGS. 1 and 2 represent just several embodiments of the present invention and that many base materials, including those disclosed herein may be utilized in the present invention.

In a further embodiment, a method of forming a chip carrier is disclosed which further comprises the steps firing said conductive layer; providing at least one component; applying a component attachment material to said dielectric layer; placing said component on said component attachment material; and connecting said component to said conductive layer.

Base Materials (Substrates)

It is preferable to use a base material or substrate which comprises an upper surface that is a good heat conductor. Examples of upper surfaces which are useful in the present invention include metal materials. Useful upper surfaces comprise, but are not limited to, metal(s) selected from the group comprising aluminum, titanium, tantalum, and zirconium. It is understood that the lower and upper opposing surfaces may be formed from the same material. Additional materials which are useful as the base material, including both upper and lower opposing surfaces, include but are not limited to the group comprising aluminum, oxidized aluminum, diamond-like carbon/aluminum, copper, metal matrix aluminum/carbon/fiber composites, silver, gold, titanium, tantalum, and zirconium.

In one embodiment of the present invention, the upper surface is oxidized (or anodized in the case of aluminum-containing substrate materials). As used herein "oxidizing" means to unite with oxygen or to form an oxide-containing film or layer on. "Oxidizing" as used herein includes anodizing. It is noted that the entire base material including the upper and lower surfaces may be supplied with an oxidized upper surface. Oxidation of the base material is not required and is merely optional in the present invention.

Dielectric Thick Film Paste or Tape Compositions

Dielectric thick film paste and tape compositions are used as the dielectric layer in the present invention. Dielectric thick film paste and tape compositions are well known in the industry and are commercially available. Generally, the type of thick film compositions that may be utilized in this invention are conventional products sold in the electronics industry. The present invention utilizes fireable thick film compositions wherein the organics of the compositions during processing are burned or fired out. The thick film paste and tape compositions typically comprise dielectric powders and/or inorganic binder (inorganic phase) dispersed in organic medium.

The organic medium is typically a solution of polymer(s) in solvent(s). Additionally, a small amount of additives, such as surfactants, may be a part of the organic medium. The most frequently used polymer for this purpose is ethyl cellulose. Other examples of polymers include ethylhydroxyethyl cellulose, wood rosin, mixtures of ethyl cellulose and phenolic resins, varnish resins, and polymethacrylates of lower alcohols can also be used. The most widely used solvents found in thick film compositions are ester alcohols and terpenes such as alpha- or beta-terpineol or mixtures thereof with other solvents such as pine oil, kerosene, dibutylphthalate, butyl carbitol, butyl carbitol acetate, hexylene glycol and high boiling alcohols and alcohol esters. In addition, volatile liquids for promoting rapid hardening after application on the substrate can be included in the vehicle. Various combinations of these and other solvents are formulated to obtain the viscosity and volatility requirements desired.

The inorganic binders which may be useful in some embodiments comprise glass powders which are commercially available from Viox Corp. as Commercial Product Nos. 24935 and 24935CM. Fillers may also be present in the inorganic phase of the present invention. Common fillers include alumina and silica, as well as many others known to those skilled in the art.

Prior to firing, a processing requirement may include an optional heat treatment such as: drying, curing, reflow, soldering and others known to those skilled in the art of thick film technology. Examples of thick film paste and tape compositions which are useful as the dielectric layer in the present invention include Commercial Product No. 3503, Dielectric A and B, commercially available from E.I. du Pont de Nemours and Company. In several embodiment dielectric thick film compositions, Dielectric A and B, useful in the present invention comprised 3% ethyl cellulose, 4% terpineol, 4% dibutyl phthalate, and 85% glass/filler. The glass and glass/filler utilized was Viox Commercial Product Nos. 24935 and 24935CM.

In one embodiment, the thick film dielectric composition of the present invention is a lead-free thick film composition. Those skilled in the art understand that a multitude of dielectric thick film compositions may work in various embodiments of the present invention. These useful compositions may vary dependant upon the application, system requirements, firing profile, etc.

In one embodiment the inorganic phase of the dielectric thick film composition is in the range of 50 to 95 weight percent, based on total thick film composition. In a further range, the inorganic phase is in the range of 60 to 90 weight percent, based on total thick film composition. In a further embodiment, the inorganic phase of the dielectric thick film composition is in the range of 80 to 90 weight percent, based on total thick film composition.

The thick film compositions may be applied by a multitude of application methods well known to those skilled in the art. The application methods include, but are not limited to, screen printing, rolling, dipping, spraying, and tape lamination.

The thick film dielectric paste and tape compositions of the present invention comprise one or more glasses, one or more resins, and one or more solvents. Upon processing or firing (at a typical firing temperature in the range of 450 to 600° C., preferably 480 to 560° C., and more preferably 500 to 560° C.), the dielectric forms a glass/ceramic composite which enhances bond strength. Due to the presence of the thick film composition (and the glasses contained therein), the bond strength between the base material and the dielectric layer is substantially higher than prior art bond strengths due to the glass/ceramic physical mechanical and chemical bonds formed. This dielectric layer is thermally reactive which allows for both physical mechanical bonding and chemical bonding to the base material.

Furthermore, upon firing, the dielectric layer formed demonstrates a reheatable non-thermoplastic behavior. Effectively, the dielectric layer formed is not thermoplastic. In some embodiments, a crystallized glass is formed upon firing.

Conductive Layer

The conductive layer is typically formed with a conductive metal. In one embodiment, the conductive layer is formed from a thick film paste or tape composition. The thick film paste or tape may be cured or fired. Typical conductive layers comprise metals selected from the group comprising Ag, Cu, Al, etc. An electric circuit may be formed with the conductive layer.

Commercially available thick film pastes and tapes may be used in the present invention. Examples of thick film paste and tape compositions which are useful as the conductive layer in the present invention include Commercial Product No. 7713, commercially available from E.I. du Pont de Nemours and Company.

Method of Forming a Chip/Component Module

From the method of forming a chip/component carrier described above, a chip/component module may be formed with additional steps. One embodiment of the present invention is a method of forming a chip (or component) module comprising: providing a base material having lower and upper opposing surfaces wherein said upper surface is oxidizable; oxidizing the upper surface of said base material thus forming a base layer and an oxidized layer; applying a dielectric thick film composition to the oxidized layer; firing the dielectric thick film composition, said base layer, and oxidized layer, thus forming a fired base layer, oxidized layer and dielectric layer; applying a conductive layer at least partially covering said dielectric layer; firing said conductive layer; providing at least one component; applying a component attachment material (FIG. 2 item 105) to said dielectric layer wherein said component attachment material is untouched by said conductive layer(s) (FIG. 2 item 104); placing said component (FIG. 2 item 106) on said component attachment material; and connecting said component to said conductive layer (in one embodiment, with two or more wire bonds) (FIG. 2 item 107). There are 2 typical methods of assembly that require different adhesive approaches: (1) Flip Chip method which uses solder bumps with underfill (epoxy) and (2) Face-up method where you can either use epoxy, or metal pads with Ag epoxy, or solder (metal pad on chip that is solderable). Various embodiments of the present invention encompass both of these methods of assembly. One embodiment of the chip module is a light emitting diode chip module for use in LED applications.

The descriptions detailed above for the base material(s), dielectric layer, and conductive layer are applicable to and may be used in the method of forming a component module embodiment(s) of the present invention. Further description of the method(s) of forming component modules are detailed below.

Component Attachment Material

When the component is attached it is typically attached with an epoxy material or solder. A lead-free solder may be used in some embodiments. For example a Au/Sn solder may be useful. See the description above regarding flip chip and face up methods.

Encapsulant

In some embodiments, a dielectric material may be used as an encapsulant. This encapsulant may be used to cover the conductive (typically silver thick film paste composition) traces for protection and/or for the added benefit of providing a reflective material for use in light emitting diode applications. For example, if the dielectric material were used as an encapsulant over the conductive traces and fired, if the encapsulant then becomes white, it will be useful as a reflective encapsulant. Various dielectric thick film compositions may be useful as the encapsulant. Those compositions include compositions which are commercially available.

EXAMPLES

The present invention will be described in further detail by giving practical examples. The scope of the invention, however, is not limited in any way by these practical examples.

Examples 1 through 17

The purpose of these experiments was to evaluate two separate DuPont experimental thick film compositions provided by E.I. du Pont de Nemours and Company, Dielectric A and Dielectric B, on anodized aluminum substrates (base material with an anodized aluminum upper surface). These dielectric compositions were thick film dielectric paste compositions. Each Dielectric A and B was tested with 4 different conductive layers (i.e., Silver A, B, C, and D). Additionally, each dielectric, Dielectric A and B, were once fired and twice fired, then both the once fired and twice fired dielectrics were tested with each of the 4 different conductive layers, thus giving 16 Examples total. A control, Example 17, with no dielectric layer was also conducted.

The substrates were cut 1"×1", 40 mil thick anodized aluminum supplied by Nimet Industries, Inc. This anodized aluminum base material comprised an anodic film upper surface layer (i.e., an anodized aluminum surface). The anodic film was 35-40 microns thick. Dielectric A utilized Viox Corp. glass powder, Commercial Product No. 24935 (Pb—Zn—B), and Dielectric B utilized Viox Corp. glass powder, Commercial Product No. 24935CM (Pb—Zn—B—Ti). The inorganic phase was ~85% by weight of the total thick film composition. The organics (organic medium or vehicle) consisted essentially of an ethyl cellulose resin, and solvent system of dibutyl phthalate and terpineol. Although other organic mediums well known to those skilled in the art are useful in the present invention.

The dielectric compositions (Dielectric A and Dielectric B) were applied by screen printing one coat (~14 um fired), drying at room temperature for 5 min and 150° C. for 15 min. The substrates were then fired @ 560° C. with a peak dwell time of ~4 minutes and a total fire time of 65 minutes. A group of parts was also re-fired at 560° C. Both the fired group and the twice fired group were then screen printed with a silver conductor (one conductor used was Commercial Product No. 7713, available from E.I. du Pont de Nemours and Company) using a DuPont serpentine electrode pattern with 80×80 mil square pads used for all evaluation tests. Four different Ag electrodes for both the once fired and twice fired groups (Electrode A, B, C, and D which utilized Silvers A, B, C, and D, respectively) were evaluated in this experiment. In each example, the silver composition(s) were screenprinted (~15 um fired thickness), dried @ room temperature for 5 minutes, dried @ 150° C. for 15 minutes and then fired @ 500° C. to form the electrode. A control part with no dielectric was also included in the experiment, as Example 17. After firing the silver conductor all groups were observed for cosmetic defects including blistering and mudcracking.

The groups were evaluated for resistance, solder acceptance, and adhesion. The resistance measurements were taken using a 4 wire multimeter (HP Model 3478A Multimeter). Resistance was tested from silver pad to silver pad.

The solder acceptance test evaluated the solder bond created when parts, assembled with wire leads over the pads, were exposed to 62Sn/36Pb/2Ag solder at a temperature of 220 degrees Celsius for a 5 second dwell time. Parts were then observed for solder acceptance (bond between electrode and wire lead).

The final evaluation was the adhesion, as demonstrated by wire pull strength. After observation, the soldered parts were tested for adhesion by making a 90 degree bend in the wire leads so that the MTS instron could test the adhesion of the wire, Ag electrode, dielectric, anodized Al interface. Pull Strengths were measured in Newtons.

Compositions Used Examples 1-16

Dielectric Compositions A and B (Paste comp) comprised: 3% ethyl cellulose, 4% terpineol, 4% dibutyl phthalate, 85% inorganic phase (i.e., glass or glass/filler) in weight percent total paste composition. The inorganic phase is described below:

| Dielectric Comp. | Viox glass no. | Glass comp | Description |
|---|---|---|---|
| Dielectric A | 24935 | Pb—Zn—B | Glass powder, Glass CTE (ppm/° C.) = 12.6, Soft pt. (° C.) = 329, Tg (° C.) = 287, Ts (° C.) = 308 |
| Dielectric B | 24935CM | Pb—Zn—B—Ti | Co-mill Glass & Filler Inorganic phase made up of approx. 40 wt. % filler (PbTiO$_3$) and remainder of inorganic phase glass of approx. 60 wt. % |

Each of the dielectric compositions, Dielectrics A and B above, were fired 1 and 2 times (as opposed to firing two separately coated dielectric layers).

Conductive Layer Compositions (Silver Compositions): 14 wt. % ethyl cellulose, 3 wt. % terpineol, 70 wt. % silver, 5 wt. % glass, based on total weight percent conductive thick film composition. Silver D comprised approximately 75 wt % silver and no glass.

| Silver Comp. | Description | Glass | Glass Composition |
|---|---|---|---|
| Silver A | Control, DuPont 7713 | Glass A | Pb—B—F—Si |
| Silver B | Pb-free version of 7713 | Glass B | Bi—Zn—B—Si—Al |
| Silver C | Pb-free version of 7713 | Glass C | Asahi ASF-1100B |
| Silver D | No glass frit version of 7713 | No glass | Not applicable |

When comparing the data it is important to note that re-firing the dielectric is optional and is not necessary. This data does show the significance and benefit of using these dielectrics with the anodized Aluminum. Without the dielectric, an average resistance of 700 Mohms was measured from Ag pad to Ag pad. With the dielectric, either A or B, and either once fired or twice fired, no conductivity was measured. Further evaluation of the dielectrics show OK solderability and adhesion with Silver D and the opportunity to optimize the silver compositions to include either a Pb-based or Pb-free silver conductive composition as an electrode candidate. The most important conclusion reached from these tests was that these dielectrics, Dielectrics A and B, do act as a suitable insulator to increase the insulation of "Al oxide layer only" and the fired film appears to be defect-free with no blistering in the dielectric layer or Ag electrode.

Examples 18-27

Hardcoat Anodized Al-3003 [Oxidized Al—This is same anodized substrate as used in previous experiments, Examples 1-16, above.]

Judgment of good and bad compositions were determined by looking at the Overall Cosmetics (mudcracking, roughness, blistering, etc) with special emphasis on mudcracking and blistering or bubbling. "Bubbling" is defined herein as an outgassing phenomenon and/or sintering phenomenon wherein a void or porous pocket is left in the fired film and leaves the film susceptible to low breakdown voltage and shorts. Another cosmetic dielectric is dewetting of the composition on the oxide layer. Any of these cosmetic defects were evaluated and if present were used to eliminate a dielectric composition candidate even before further electrical testing (shorting and breakdown voltage) was evaluated.

With the Hardcoat anodized Al-3003 (thickness of 40 mils) several compositions, did not succeed. The compositions listed in the following table did not give promising results when printed and fired on this substrate at the 540° C. nominal peak temperature.

| Dielectric | Glass composition | # of layers | Avg thickness (um) | Firing Temp | Major cosmetic defect |
|---|---|---|---|---|---|
| Example No. 18 - Dielectric C | Viox Commercial Product No. 24927 (PbAlBTiZn) present at approx. 86 wt. % total thick film composition, no filler, TCE = 11.4, Ts = 353° C. | 1 and 2 | 14/27 | 540 and 500 | Blister/bubble |
| Example No. 19 - Dielectric D-DuPont Commercial Product No. 3503 | Viox Commercial Glass Product No. 24927CM (PbAlBTiZn) - Co-milled | 1 and 2 | 14/27 | 540 and 500 | Mudcrack/dewetting |
| Example No. 20 - Dielectric E | Viox Commercial Glass Product No. V2086 (Pb-free Thallium containing), TCE = 10.6, Ts = 451° C. | 1 | 14 | 540 | Severe mudcrack to flaking off |
| Example No. 21 - Dielectric F | Viox Commercial Glass Product No. V2088 (Pb-free Thallium containing), TCE = 10.6, Ts = 448° C. | 1 | 14 | 540 | Severe mudcrack to flaking off |

-continued

| Dielectric | Glass composition | # of layers | Avg thickness (um) | Firing Temp | Major cosmetic defect |
|---|---|---|---|---|---|
| Example No. 22 - Dielectric G | Viox Commercial Glass Product No. V2088CM (Pb-free Thallium containing with Si aluminate filler), TCE = 5.3, | 1 | 14 | 540 | Severe mudcrack to flaking off |
| Example 23 - Dielectric H | Asahi Commercial Product No. ASF-1100B | 1 | 14 | 540 | Flaking off |
| Example 24 - Dielectric I | Glass I with silica filler | 1 | 14 | 540 | Flaking off |
| Example 25 - Dielectric I (remake) | Glass I with silica filler | 1 | 14 | 540 | Flaking off |
| Example 26 - Dielectric J | Glass I - no filler | 1 | 14 | 540 | Flaking off |
| Example 27 - Dielectric K | Glass II - Pb-free glass with silica filler | 1 | 14 | 540 | Flaking off |

Glass Composition(s) in Weight Percent Total Glass Composition

| Glass ID No. | $SiO_2$ | $Al_2O_3$ | $B_2O_3$ | CaO | ZnO | $Bi_2O_3$ | $SnO_2$ | $Na_2O$ | $Li_2O$ |
|---|---|---|---|---|---|---|---|---|---|
| Glass I | 1.7 | 0.3 | 11.8 | | | 84.7 | 2.50 | 0.4 | 0.8 |
| Glass II | 7.11 | 2.13 | 8.38 | 0.53 | 12.03 | 69.82 | | | |

None of Pb-free compositions offered an OK fired film. The Viox Corp., Commercial Product No. 24935 and 24935CM were able to show good results at elevated temperatures of 560 degrees C. while Viox Corp. Commercial Product No. 24927 showed fairly good results when fired lower than normal at 480 degrees C. Even this glass however showed signs of mudcracking slightly. It is important to note that any of these Dielectric Compositions may show good results with modifications in processing profile, including firing conditions, etc., or modifications with the entire system (i.e., if processed with different base material or conductive layer).

Examples 28-43

Bare Al Substrate (Bare Al-1050)

Testing, was performed on bare aluminum substrate (base material) with no anodized layer. The only parameters different than those written above were that 1) an oxide layer is absent and 2) the firing temperature was 520 degrees C. The following table separates compositions which performed good with those that were no good (NG). The composition of these materials was glass, optional filler (silica), ethyl cellulose resin, and solvents terpineol.

| Composition | Glass composition | Layers | Fired thickness (um) | Major cosmetic defect | Status |
|---|---|---|---|---|---|
| Example 28 - Dielectric D - DuPont Commercial Product No. 3503 | Viox Commercial Glass Product No. 24927CM (PbAlBTiZn) - Co-milled | 1 | 14 | None | OK |
| Example 29 - Dielectric L | Viox Commercial Product No. 24109 (PbBSiAl), TCE = 11, Ts = 361° C. | 1 | 16 | Bubbles | NG |
| Example 30 - Dielectric M | BSiAlPb containing frit with Silica filler, TCE = 7.7, Ts = 470° C. | 1 | 22 | Mudcrack | NG |
| Example 31 - Dielectric N | BSiAlPb containing frit, TCE = 7.7, Ts = 470° C. | 1 | 27 | None | OK |

-continued

| Composition | Glass composition | Layers | Fired thickness (um) | Major cosmetic defect | Status |
|---|---|---|---|---|---|
| Example 32 - Dielectric O | Y milled Glass II above, TCE = 9, Ts = 453° C. | 1 | 11 | None | OK |
| Example 33 - Dielectric P | Pb-free ceramic frit - high TCE frit, TCE = 22 | 1 | 16 | Bubble | NG |
| Example 34 - Dielectric H | Asahi Commercial Product No. ASF-1100B | 1 | 12 | Bubble | NG |
| Example 35 - Dielectric J | Glass I | 1 | 10 | craters | NG |
| Example 36 - Dielectric J | Glass II | 2 | 28 | None | OK |
| Example 37 - Dielectric L | Viox Commercial Product No. 24109 (PbBSiAl), TCE = 11, Ts = 361° C. | 2 | 45 | Bubble | NG |
| Example 38 - Dielectric M | BSiAlPb containing frit with Silica filler, TCE = 7.7, Ts = 470° C. | 2 | 50 | Mudcrack | NG |
| Example 39 - Dielectric N | BSiAlPb containing frit, TCE = 7.7, Ts = 470° C. | 2 | 42 | None | OK |
| Example 40 - Dielectric O | Y milled Glass II above, TCE = 9, Ts = 453° C. | 2 | 32 | None | OK |
| Example 41 - Dielectric P | Pb-free ceramic frit - high TCE frit, TCE = 22 | 2 | 70 | Bubble | NG |
| Example 42 - Dielectric H | Asahi Commercial Product No. ASF-1100B | 2 | 24 | Bubble | NG |
| Example 43 - Dielectric J | Glass I | 2 | 23 | Craters | NG |

Three compositions looked OK. Dielectric H and J compositions were taken further by testing BDV, adhesion, and solderability. It is important to note that any of these Dielectric Compositions may show good results with modifications in processing profile, including firing conditions, etc., or modifications with the entire system (i.e., if processed with different base material or conductive layer).

Further Examples on Metal Matrix Composite (MMC) Substrate (Bare Al with Nickel Plated or Al and Nickel Plated)

This composite of Aluminum with carbon fibers, although differing from other aluminums by TCE, also has a much rougher surface. Surface roughness may have effect on mudcracking. All dielectrics above were also tested on MMC and all had mudcracking issues.

What is claimed is:

1. A method of forming a chip carrier comprising:
providing a base material having lower and upper opposing surfaces;
providing a dielectric thick film composition comprising 3% ethyl cellulose, 4% terpineol, 4% dibuyl phthalate, 85% inorganic phase in weight percent of the composition;
applying said dielectric thick film composition to said upper surface of said base material;
firing said dielectric thick film composition and said base material at a firing temperature such that the dielectric forms a glass/ceramic composite, thus forming a structure comprising a fired base layer and a fired dielectric layer; and
applying a conductive layer at least partially covering said dielectric layer, and wherein said base material upper surface is oxidized,
wherein the fired film has no conductivity.

2. The method of claim 1 wherein said base material is selected from the group consisting of aluminum, oxidized aluminum, alloys of aluminum, diamond-like carbon/aluminum, copper, a metal matrix of aluminum, copper, a metal matrix of aluminum/carbon/fiber composites.

3. The method of claim 1 wherein said dielectric thick film composition is selected from the group comprising a thick film paste composition and a thick film tape composition and wherein said firing temperature is in the range of 450° C. to 600° C.

4. The method of claim 1 further comprising drying the dielectric thick film composition prior to firing.

5. The method of claim 1 wherein said conductive layer is a thick film paste composition.

6. The method of claim 2 wherein said upper surface comprises oxidized metal selected from the group consisting of aluminum, titanium, tantalum, and zirconium.

7. The method of claim 1 wherein said chip carrier is a light emitting diode chip carrier.

8. A method of forming a chip carrier comprising:
providing a base material having lower and upper opposing surfaces and oxidizing said base material upper surface;

providing a dielectric thick film composition;

applying said dielectric thick film composition to said upper surface of said base material;

firing said dielectric thick film composition and said base material at a firing temperature in the range of 450° C. to 600° C. wherein the dielectric forms a glass/ceramic composite, thus forming a structure comprising a fired base layer and a fired dielectric layer;

applying a conductive layer at least partially covering said dielectric layer;

firing said conductive layer;

providing at least one component;

applying a component attachment material to said dielectric layer;

placing said component on said component attachment material; and connecting said component to said conductive layer;

wherein the fired film has no conductivity.

9. The method of claim 8 further comprising drying the dielectric thick film composition prior to firing.

10. The method of claim 8 wherein said component is connected to said conductive layer with a material selected from the group consisting of: two or more wire bonds; solder material; and conductive die attach materials, including but not limited to conductive epoxy material.

11. The method of claim 8 wherein said component attachment material is untouched by said conductive layer.

12. The method of claim 8 wherein said conductive layer comprises Ag.

13. The method of claim 8 further comprising applying an encapsulant to partially cover said conductive layer.

14. The method of claim 8 wherein said conductive layer is plated with a Ni—Au layer.

15. The method of claim 8 wherein the dielectric thick film composition and the conductive layer are fired in one step.

16. The method of claim 8 wherein said chip carrier is a light emitting diode chip module.

17. A light emitting diode chip carrier formed by the method of claim 1.

18. A light emitting diode chip module formed by the method of claim 8.

* * * * *